(12) United States Patent
Hsu

(10) Patent No.: US 10,244,653 B2
(45) Date of Patent: Mar. 26, 2019

(54) MULTI-AXIS ROTARY SHAFT LINK DEVICE

(71) Applicant: FIRST DOME CORPORATION, New Taipei (TW)

(72) Inventor: An Szu Hsu, New Taipei (TW)

(73) Assignee: First Dome Corporation, New Taipei (TW)

( * ) Notice: Subject to any disclaimer, the term of this patent is extended or adjusted under 35 U.S.C. 154(b) by 305 days.

(21) Appl. No.: 15/281,725

(22) Filed: Sep. 30, 2016

(65) Prior Publication Data

US 2018/0035565 A1 Feb. 1, 2018

(30) Foreign Application Priority Data

Jul. 27, 2016 (TW) .............................. 105211310 U

(51) Int. Cl.
*H05K 7/16* (2006.01)
*E05D 3/06* (2006.01)
*E05D 7/00* (2006.01)
*E05D 11/00* (2006.01)
*E05D 11/08* (2006.01)
*F16H 19/04* (2006.01)

(52) U.S. Cl.
CPC ................. *H05K 7/16* (2013.01); *E05D 3/06* (2013.01); *E05D 7/009* (2013.01); *E05D 11/0054* (2013.01); *E05D 11/082* (2013.01); *F16H 19/04* (2013.01); *E05D 2011/0072* (2013.01); *E05Y 2900/606* (2013.01); *Y10T 16/541* (2015.01)

(58) Field of Classification Search
CPC . Y10T 16/541; Y10T 16/547; Y10T 16/5476; E05D 3/122; E05D 3/06; E05D 5/10; E05D 7/009; E05D 11/0054; E05D 11/082; E05D 2005/106; E05D 2011/0072; E05Y 2900/606; G06F 1/1681; G06F 1/1616; F16H 19/04; H04M 1/0216; H04M 1/022; H05K 5/0226; H05K 7/16
USPC ........ 16/354, 366, 370; 361/679.06, 679.27; 379/433.13; 455/575.3
See application file for complete search history.

(56) References Cited

U.S. PATENT DOCUMENTS 3,422,487 A * 1/1969 Dickinson ................. E05D 3/06
16/273
3,483,588 A * 12/1969 Hover ..................... B63B 19/19
16/354
4,599,998 A * 7/1986 Castillo ................. A61F 5/0123
16/354

(Continued)

*Primary Examiner* — William L Miller
(74) *Attorney, Agent, or Firm* — Rosenburg, Klein & Lee

(57) ABSTRACT

A multi-axis rotary shaft link device has a simplified structure occupying less room and is easy to assemble. The multi-axis rotary shaft link device includes a transmission unit disposed on a first shaft, a reaction unit disposed on a second shaft and a link unit disposed between the transmission unit and the reaction unit for making the first and second shafts synchronously rotate. The second shaft and a third shaft are assembled with a driven module for rotating the third shaft and a transmission unit disposed on the third shaft. A link unit is disposed between the third shaft and a fourth shaft, whereby the fourth shaft and a reaction unit disposed on the fourth shaft can synchronously rotate with the third shaft. The multi-axis rotary shaft link device can freely rotate around multiple rotational centers, which can be smoothly opened and closed.

24 Claims, 5 Drawing Sheets

(56) References Cited

U.S. PATENT DOCUMENTS

| | | | | |
|---|---|---|---|---|
| 8,720,011 | B1* | 5/2014 | Hsu | E05D 3/122 |
| | | | | 16/354 |
| 8,869,352 | B2* | 10/2014 | Hsu | E05D 3/122 |
| | | | | 16/354 |
| 2009/0070961 | A1* | 3/2009 | Chung | E05D 3/122 |
| | | | | 16/354 |
| 2014/0174226 | A1* | 6/2014 | Hsu | E05D 3/122 |
| | | | | 74/98 |
| 2015/0159413 | A1* | 6/2015 | Chen | E05D 3/122 |
| | | | | 16/342 |
| 2015/0267450 | A1* | 9/2015 | Chiang | G06F 1/1681 |
| | | | | 16/354 |
| 2015/0342068 | A1* | 11/2015 | Su | G06F 1/1681 |
| | | | | 16/354 |
| 2015/0362958 | A1* | 12/2015 | Shang | G06F 1/1681 |
| | | | | 361/679.58 |
| 2016/0011632 | A1* | 1/2016 | Hsu | E05D 3/122 |
| | | | | 16/354 |
| 2016/0032633 | A1* | 2/2016 | Hsu | E05D 3/122 |
| | | | | 16/368 |
| 2016/0048174 | A1* | 2/2016 | Hsu | G06F 1/1681 |
| | | | | 16/342 |
| 2016/0060927 | A1* | 3/2016 | Xu | E05D 3/122 |
| | | | | 361/679.55 |
| 2016/0090763 | A1* | 3/2016 | Hsu | E05D 3/06 |
| | | | | 16/354 |
| 2017/0235337 | A1* | 8/2017 | Vic | E05D 3/12 |
| | | | | 361/679.55 |
| 2017/0328102 | A1* | 11/2017 | Kato | E05D 11/087 |
| 2018/0032110 | A1* | 2/2018 | Hsu | E05D 3/122 |
| 2018/0059740 | A1* | 3/2018 | Kato | F16C 11/045 |

* cited by examiner

MULTI-AXIS ROTARY SHAFT LINK DEVICE

BACKGROUND OF THE INVENTION

1. Field of the Invention

The present invention relates generally to a multi-axis rotary shaft link device, and more particularly to a multi-axis rotary shaft link device including a first shaft, a second shaft, a third shaft and a fourth shaft. A link unit is disposed between the first and second shafts for making the first and second shafts synchronously rotate. Also, a link unit is disposed between the third and fourth shafts for making the third and fourth shafts synchronously rotate. The second and third shafts are assembled with a driven module for assembling with an electronic apparatus. The cooperative space between the components of the multi-axis rotary shaft link device is minified to enhance the transmission precision.

2. Description of the Related Art

There are various electronic apparatuses provided with covers or display screens, such as mobile phones, notebooks, PDA and electronic books. The covers or display screens are pivotally mounted on the electronic apparatuses via pivot pins or rotary shafts, whereby the covers or the display screens can be freely rotated and opened/closed under external force.

In order to operate the display module (such as the screen) and/or the apparatus body module of the electronic apparatus in more operation modes to widen the application range thereof, a conventional dual-shaft mechanism mounted between the display module and the apparatus body module has been developed to rotate the display module and/or the apparatus body module by different angles in accordance with different operation modes.

With respect to the operation, motion and structural design of such rotary shaft or pivot shaft device, in consideration of the supporting structural strength and operational smoothness, generally two sets of conventional pivot shaft devices are respectively disposed on two sides of the pivotally connected edges of the display module and apparatus body module of an electronic apparatus (such as a notebook). When operating/rotating the display screen or the display module to open the same, the coordination between the rotary shafts is not so idealistic. Moreover, the two pivot shaft devices are such arranged that they are nearly centered at the same central axis. Therefore, the freeness of the rotation of the pivot shaft devices is limited. As a result, during the rotation process of the electronic apparatus, a user can hardly smoothly open or close the electronic apparatus.

In order to improve the above shortcoming, a conventional pivot shaft device with multiple rotational centers has been disclosed. Such multi-joint rotary shaft structure includes a combination of a driving joint assembly and a driven joint assembly. An intermediate link plate assembly is disposed between the two opposite joint plates of the driving joint assembly. The two opposite joint plates are formed with synchronous driving sections engaged with the intermediate link plate assembly. The driven joint assembly has two driven plates disposed between the two opposite joint plates of the driving joint assembly. A shaft pin is assembled with the opposite joint plates in a position directed to the inner ends of the opposite joint plates corresponding to the outer ends of the driven plates. A shaft pin is assembled with the intermediate link plate assembly in a position directed to the outer ends of the intermediate link plate assembly corresponding to the inner ends of the driven plates. Accordingly, multiple driving joint assemblies and multiple driven joint assemblies are side by side arranged to together form a multi-joint rotary shaft structure.

However, as well known by those who are skilled in this field, the rotary shaft structure or the relevant connection components thereof are designed with the requirement for lightweight and thin electronic apparatus taken into consideration. In the case that the structures and motional range of the multiple gears or the link plate assembly and driven plate assembly for transmitting power are as minified as possible, the engagement/transmission working depth between these components will be resultantly reduced. This is unbeneficial to the engagement and power transmission and often causes an idling travel due to rotational slippage. Also, the operational hand feeling of a user will be deteriorated. This is not what we expect.

To speak representatively, the conventional rotary shaft or pivot shaft structure and the relevant connection components thereof have some shortcomings in use and structural design. The rotary shaft structure and the relevant components can be redesigned to eliminate these shortcomings. For example, in condition that the requirement for lightweight and thin design of the electronic apparatus is satisfied and the structure can be synchronously operated, the cooperative gaps or motional ranges between all the rotary shafts and the components are as minified as possible. In this case, the entire electronic apparatus can be designed with a simplified structure and beautiful appearance to improve the shortcoming of the conventional rotary shaft structure that the components have larger volume and occupy much room. Moreover, in condition of easy assembly, according to the specification of the product, the number of the link devices can be easily changed or adjusted to achieve the object of modularized assembly. Therefore, the shortcomings of the conventional rotary shaft or pivot shaft structure can be eliminated. Also, the structure and the use form of the conventional rotary shaft or pivot shaft can be changed to widen the application range thereof.

SUMMARY OF THE INVENTION

It is therefore a primary object of the present invention to provide a multi-axis rotary shaft link device has a simplified structure occupying less room and is easy to assemble. The multi-axis rotary shaft link device includes a transmission unit disposed on a first shaft, a reaction unit disposed on a second shaft and a link unit disposed between the transmission unit and the reaction unit for making the first and second shafts synchronously rotate. The second shaft and a third shaft are assembled with a driven module for rotating the third shaft and a transmission unit disposed on the third shaft. A link unit is disposed between the third shaft and a fourth shaft, whereby the fourth shaft and a reaction unit disposed on the fourth shaft can synchronously rotate with the third shaft. The multi-axis rotary shaft link device can freely rotate around multiple rotational centers to form a system, which can be smoothly opened and closed. Moreover, according to the specification of the product, the multi-axis rotary shaft link device can achieve the object of modularized assembly.

In the above multi-axis rotary shaft link device, the transmission units of the first and third shafts and the reaction units of the second and fourth shafts are gears. The link unit is in the form of a plate-like body. Two ends of the link unit are formed with driving sections as a row of tooth structures for respectively assembling (or engaging) with the transmission units and the reaction units. Each of the first, second, third, and fourth shafts has a pivoted section and an assembled section. A torque module is mounted on the assembled sections. The transmission units and the reaction units are disposed between the assembled sections and the pivoted sections. The tail end sections of the pivoted sections are formed with noncircular (for example, rectangular) cross-sectional structures.

In the above multi-axis rotary shaft link device, the link unit is disposed between two restriction plates. Each restriction plate is formed with a rail. The link unit is permitted to reciprocally move along the rails.

The present invention can be best understood through the following description and accompanying drawings, wherein:

DETAILED DESCRIPTION OF THE PREFERRED EMBODIMENTS

Figure 1:
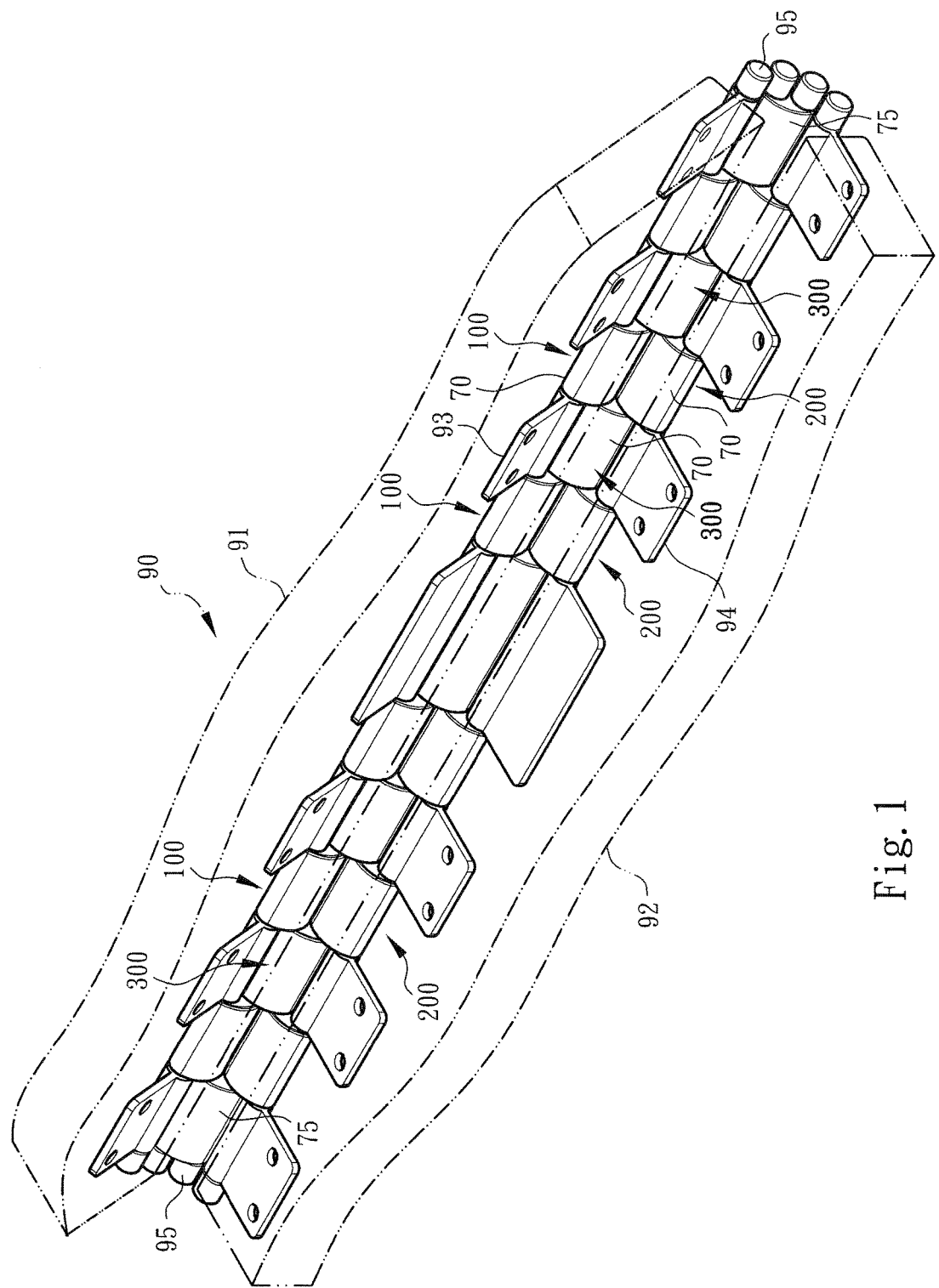
FIG. 1 is a perspective assembled view of the present invention, in which the phantom lines show the display module and apparatus body module of the electronic apparatus.
Figure 2:
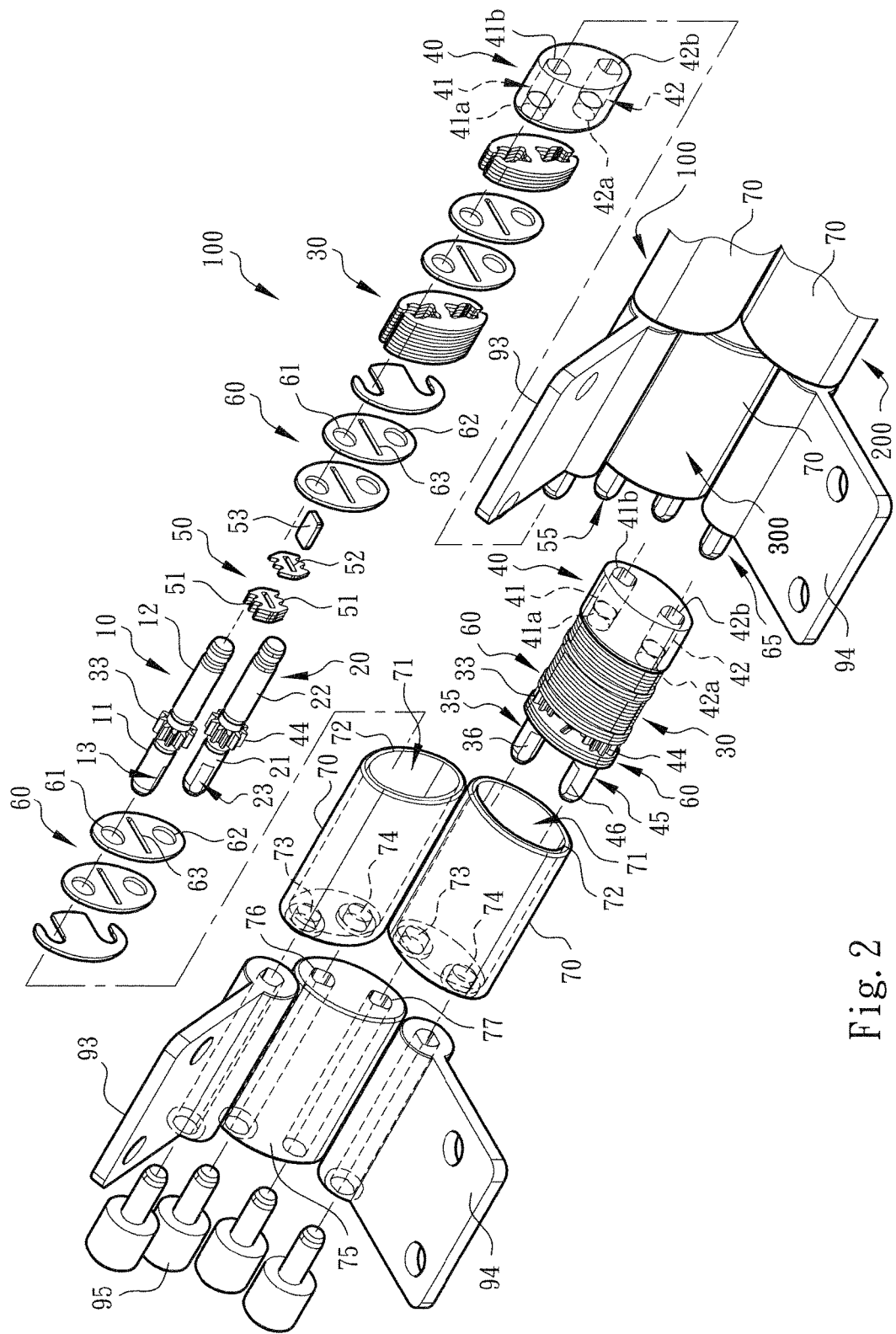
FIG. 2 is a perspective partially exploded view of the present invention according to FIG. 1.
Figure 3:
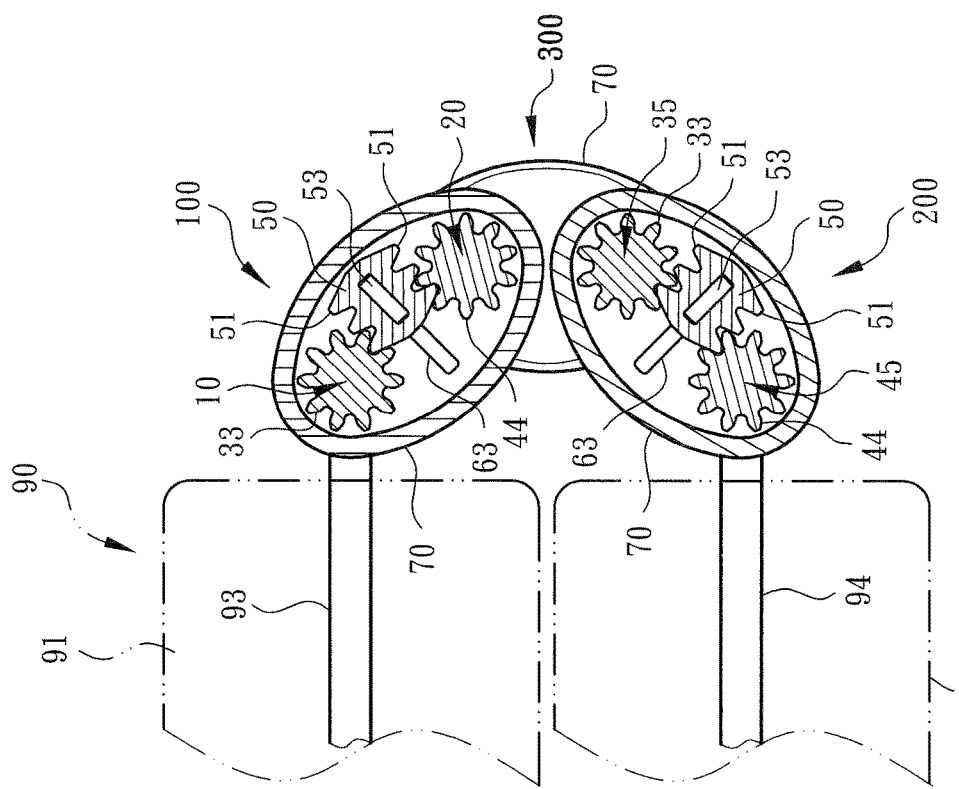
FIG. 3 is a sectional view of the present invention.

Please refer to FIGS. 1, 2 and 3. The multi-axis rotary shaft link device of the present invention includes an assembly of multiple modularized link devices at least having a first link device 100 and a second link device 200. The first link device 100 includes a first shaft 10 and a second shaft 20 in parallel to the first shaft 10. Each of the first and second shafts 10, 20 has a pivoted section 11, 21 and an assembled section 12, 22. The tail end section 13, 23 of the pivoted section 11, 21 is formed with a noncircular (for example, rectangular) cross-sectional structure. The assembled section 12, 22 is assembled with a torque module 30 and a driven module 40. When the action force applied by a user to the first and second shafts 10, 20 for operating/rotating the first and second shafts 10, 20 disappears, the torque module 30 immediately locates the first and second shafts 10, 20.

In this embodiment, the first shaft 10 has a transmission unit 33 disposed between the pivoted section 11 and the assembled section 12. The second shaft 20 has a reaction unit 44 disposed between the pivoted section 21 and the assembled section 22. The transmission unit 33 and the reaction unit 44 are gear structures. In addition, a link unit 50 is disposed between the transmission unit 33 of the first shaft 10 and the reaction unit 44 of the second shaft 20, whereby the first and second shafts 10, 20 can synchronously rotate.

To speak more specifically, the link unit 50 is at least one plate-like body or an assembly of multiple plate-like bodies. As shown in the drawings, each of the upper and lower ends of the link unit 50 is formed with a driving section 51 as a row of tooth structures. The driving sections 51 of the upper and lower ends of the link unit 50 are respectively engaged or assembled with the transmission unit 33 of the first shaft 10 and the reaction unit 44 of the second shaft 20. A support section 53 protrudes from at least one side or two sides of the link unit 50. Alternatively, the link unit 50 is formed with an assembling hole 52 for assembling with the support section 53.

As shown in the drawings, restriction plates 60 are disposed on the pivoted section 11 and the assembled section 12 of the first shaft (or at least one side or two sides of the transmission unit 33) and the pivoted section 21 and the assembled section 22 of the second shaft (or at least one side or two sides of the reaction unit 44). Two ends of each restriction plate 60 are formed with shaft holes 61, 62 for pivotally connecting with the first and second shafts 10, 20 respectively. A middle section of the restriction plate 60 (between the two shaft holes 61, 62) is formed with a rail 63 normal to the axis of the restriction plate 60. The rail 63 serves to receive the support section 53 of the link unit 50, whereby the support section 53 and the link unit 50 are permitted to reciprocally move along the rail 63.

In a preferred embodiment, the driven module 40 of the assembled section 12 of the first shaft and the assembled section 22 of the second shaft is a sleeve structure. According to the direction of FIG. 3, the driven module 40 is formed with an internal upper shaft hole 41 and an internal lower shaft hole 42. The upper and lower shaft holes 41, 42 are respectively formed with circular cross-sectional sections 41a, 42a and noncircular (for example, rectangular) cross-sectional sections 41b, 42b.

The first and second shafts 10, 20, the torque module 30, the driven module 40, the link unit 50 and the restriction plates 60 are together enclosed in an interior space 71 of a case 70 to form the first link device 100. The case 70 has an opening 72 in communication with the interior space 71. According to the direction of the drawings, the other side of the case 70 is formed with an upper shaft hole 73 and a lower shaft 74 opposite to the opening 72 for pivotally connecting with the pivoted sections 11, 21 of the first and second shafts respectively.

As shown in the drawings, the second link device 200 is identical to the first link device 100 in structure. The second link device 200 has a third shaft 35 and a fourth shaft 45. The third shaft 35 has a transmission unit 33, while the fourth shaft 45 has a reaction unit 44.

Referring to FIGS. 1 and 2, two fixing boards 93, 94 are positioned at two ends of the electronic apparatus 90. A subsidiary case 75 is arranged between the two fixing boards 93, 94. According to the direction of the drawings, the subsidiary case 75 is formed with two subsidiary shaft holes 76, 77 extending in the axial direction of the subsidiary case 75. One end of each of the subsidiary shaft holes 76, 77 is formed with a noncircular (for example, rectangular) cross-sectional structure for pivotally connecting with the rotary shafts (such as the second shaft 20 and the third shaft 35). The subsidiary case 75 is movable along with the rotation of the rotary shafts. The other end of each of the subsidiary shaft holes 76, 77 is formed with a circular cross-sectional structure for assembling with a shaft pin 95.

Please refer to FIGS. 1, 2 and 3. In the case that multiple link devices are assembled with the display module 91 and apparatus body module 92 of the electronic apparatus 90, the pivoted section 11 of the first shaft of the first link device 100 cooperates with the fixing board 93 to assemble with the display module 91. The pivoted section (or tail end section 46) of the fourth shaft 45 of the second link device 200 cooperates with the other fixing board 94 to assemble with the apparatus body module 92.

As shown in the drawings, a third link device 300 is arranged between the two fixing boards 93, 94. The third link device 300 is identical to the first and second link devices 100, 200 in structure. The tail end section 23 of the pivoted section 21 of the second shaft is inserted into the noncircular (for example, rectangular) cross-sectional section 41b of the upper shaft hole 41 of the driven module of the third link device 300. The tail end section 36 of the pivoted section of the third shaft 35 is inserted into the noncircular (for example, rectangular) cross-sectional section 42b of the lower shaft hole 42 of the driven module of the third link device 300.

Please now refer to FIG. 3, which shows the structural cooperation between the first and second link devices 100, 200 in the state that the display module 91 and the apparatus body module 92 are positioned in a closed position. Under such circumstance, the transmission unit 33 of the first shaft 10 and the reaction unit 44 of the second shaft 20 are respectively engaged with the driving sections 51 of the link unit 50. The transmission unit 33 of the third shaft 35 and the reaction unit 44 of the fourth shaft 45 are respectively engaged with the driving sections 51 of the link unit 50. At this time, the position of the link unit 50 of the first link device 100 in the rail 63 and the position of the link unit 50 of the second link device 200 in the rail 63 are defined as first positions.

Figure 4:
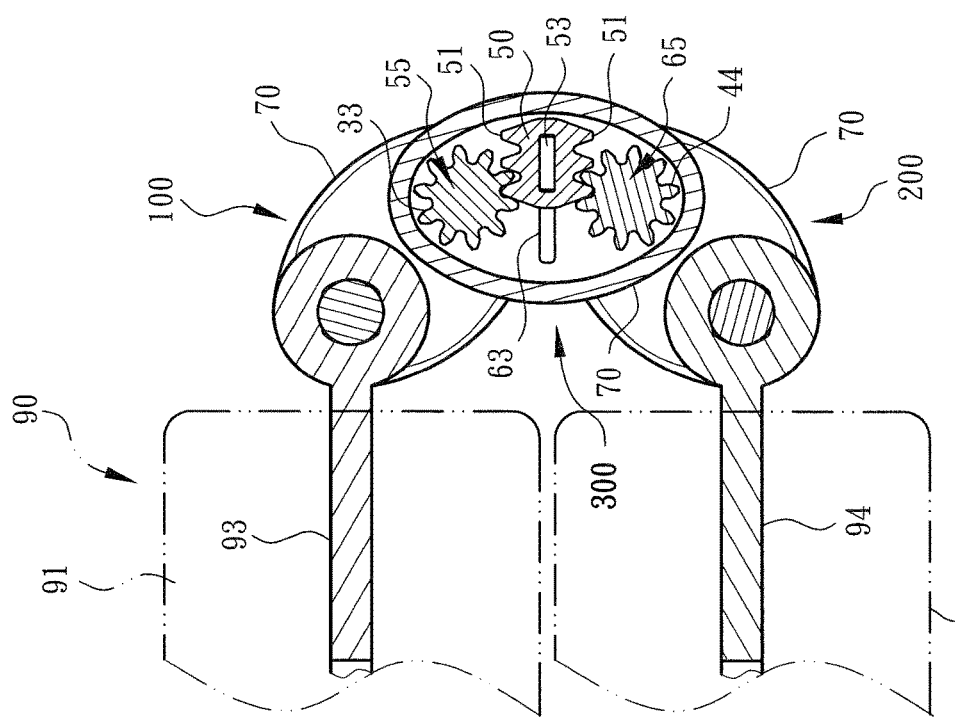
FIG. 4 is another sectional view of the present invention.

FIG. 4 shows the structural cooperation between the fixing boards 93, 94 and the third link device 300. The rotary shafts of the third link device 300 are defined as a fifth shaft 55 and a sixth shaft 65. The fifth shaft 55 has a transmission unit 33, while the sixth shaft 65 has a reaction unit 44. It should be noted that each of the fifth and sixth shafts 55, 65 has a pivoted section and an assembled section. The tail end section of the pivoted section of each of the fifth and sixth shafts 55, 65 is formed with a noncircular (for example, rectangular) cross-sectional structure. The transmission unit 33 of the fifth shaft 55 and the reaction unit 44 of the sixth shaft 65 are respectively engaged with the driving sections 51 of the link unit 50. At this time, the position of the link unit 50 of the third link device 300 in the rail 63 is defined as a first position.

Figure 5:
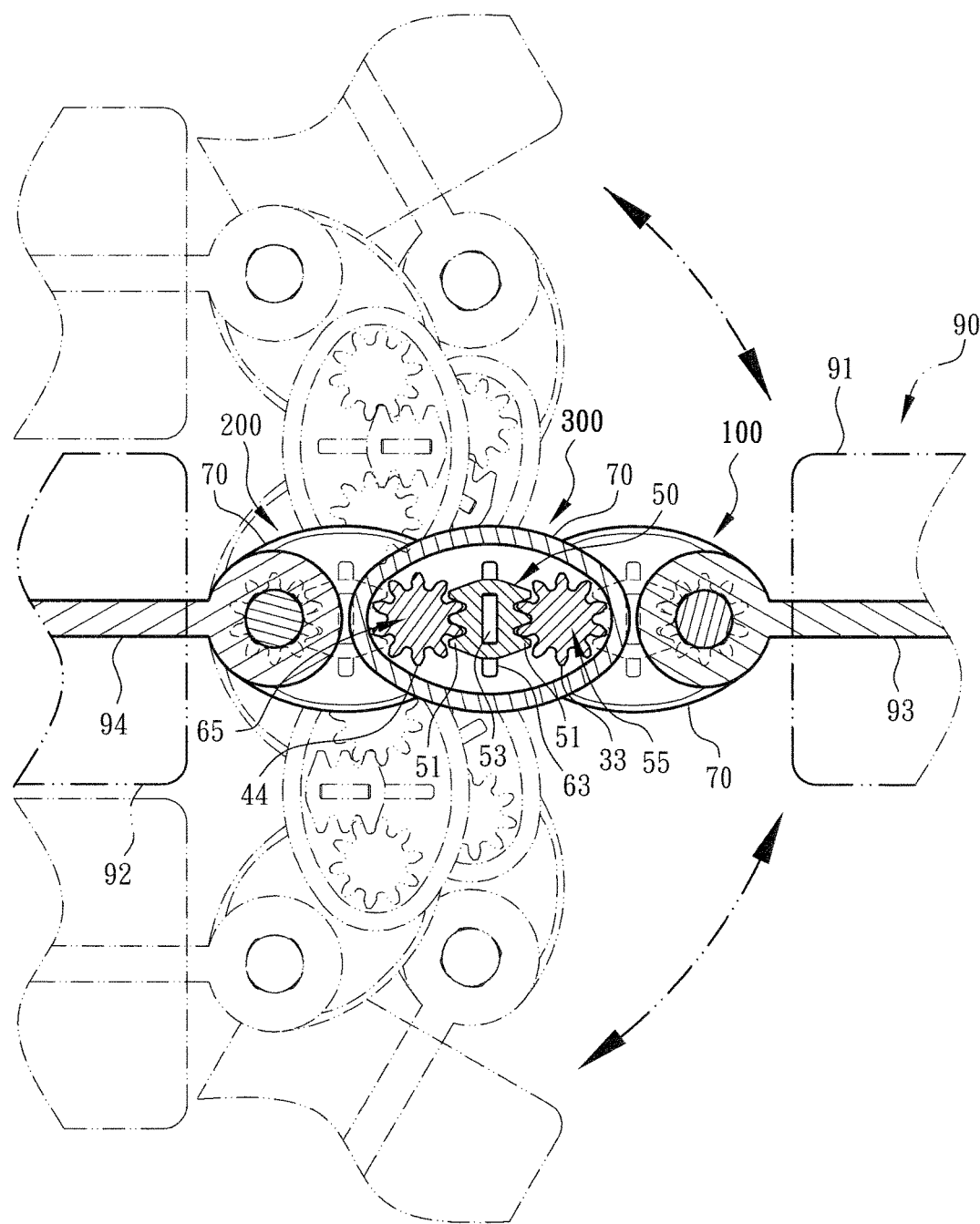
FIG. 5 is a sectional view of the present invention according to FIG. 4, showing the operation of the present invention.

Please now refer to FIG. 5, which shows that the display module 91 or the apparatus body module 92 drives the fixing board 93 or the fixing board 94 to move to an opened position. At this time, the link unit 50 of the third link device 300 (or the first link device 100 or the second link device 200) is moved along the rail 63 from the first position to a second position opposite to the first position.

Figure 6:
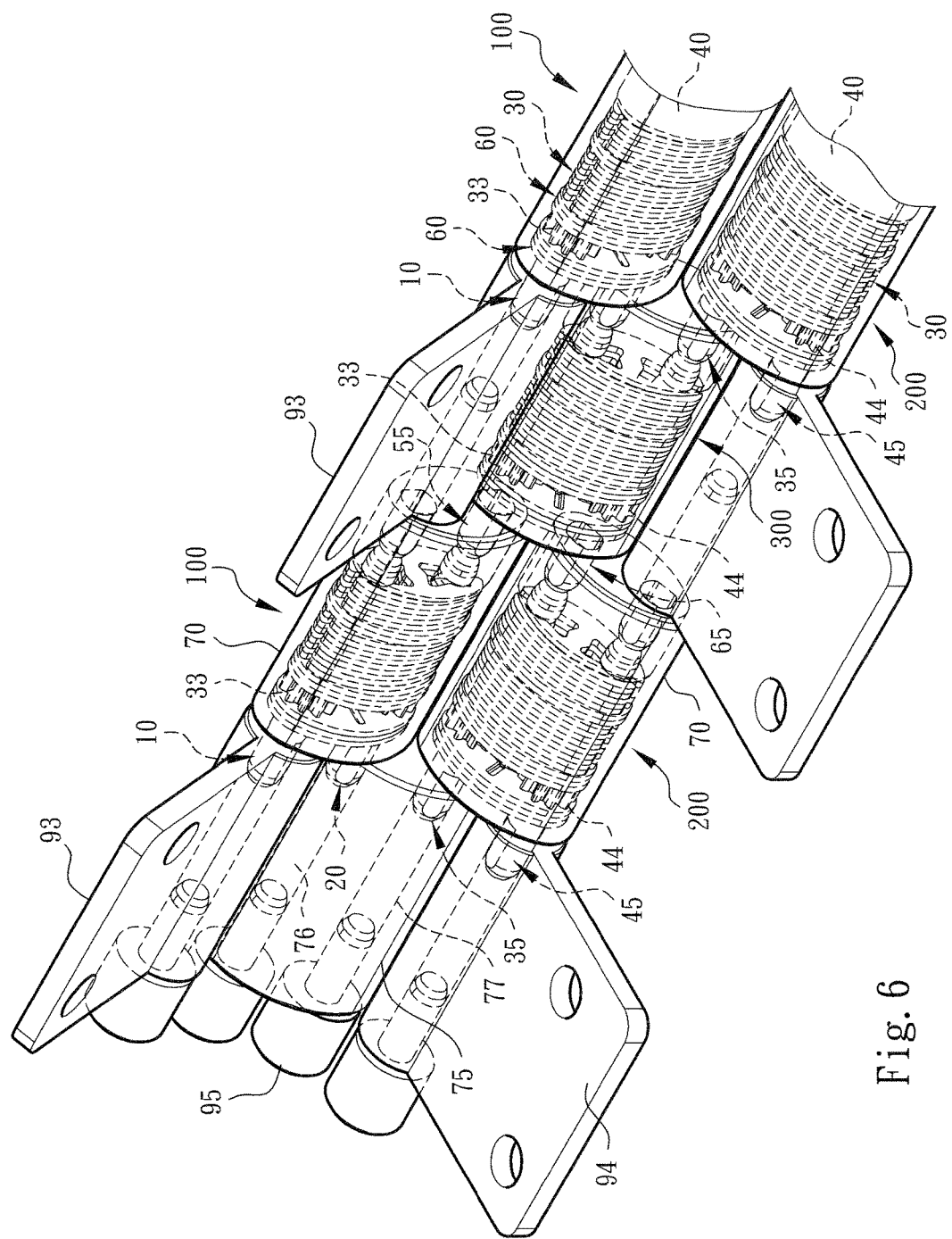
FIG. 6 is a perspective view showing the structure of a part of the present invention.

To speak more specifically, referring to FIGS. 5 and 6, when the display module 91 drives the fixing board 93 and the pivoted section (the tail end section 13 with noncircular (for example, rectangular) cross-section) of the first shaft to move or (clockwise) rotate to the opened position, the transmission unit 33 of the first shaft 10 drives the link unit 50 to move along the rail 63 from the first position to the second position, whereby the link unit 50 drives the reaction unit 44 and the second shaft 20 to rotate in a direction reverse to the rotational direction of the first shaft 10, (that is, the second shaft 20 is counterclockwise rotated).

As aforesaid, the second shaft 20 is inserted in the driven module 40 of the third link device 300. Therefore, when the second shaft 20 is rotated, the driven module 40 is driven by the second shaft 20 to move. At this time, in response to the motion of the driven module 40, the third shaft 35 is forcedly rotated (clockwise) in a direction reverse to the rotational direction of the second shaft 20. At the same time, the third shaft 35 drives the link unit 50 of the second link device 200 to move along the rail 63 from the first position to the second position, whereby the link unit 50 drives the fourth shaft 45, the fixing board 94 and the apparatus body module 92 to rotate in a direction reverse to the rotational direction of the third shaft 35, (that is, the fourth shaft 45 is counterclockwise rotated). Accordingly, the display module 91 and the apparatus body module 92 can be smoothly operated and freely rotated around multiple rotational centers from the closed position (or defined as 0° position) to the opened position (or defined as 360° position).

It can be known from the above description that the third link device 300 between the fixing boards 93, 94 (or the first shaft 10 and the fourth shaft 45) can be replaced with the driven module 40. The driven module 40 is assembled with the tail end section 23 of the pivoted section 21 of the second shaft and the tail end section 36 of the pivoted section of the third shaft. This can achieve the same effect as the above embodiment.

According to the above arrangement, in condition of synchronous rotation in operation, in comparison with the conventional rotary shaft structure, the multi-axis rotary shaft link device of the present invention has the following advantages:

1. The multi-axis rotary shaft link device and the relevant components/structures have been redesigned to be different from the conventional rotary shaft structure. For example, the first shaft 10 of the first link device 100 has a transmission unit 33 and the third shaft 35 of the second link device 200 also has a transmission unit 33. The second shaft 20 of the first link device 100 has a reaction unit 44 and the fourth shaft 45 of the second link device 200 also has a reaction unit 44. The plate-like link units 50 are engaged between the transmission units 33 and the reaction units 44. Each link unit 50 has driving sections 51 as a row of tooth structures and a protruding support section 53, whereby the link unit 50 is reciprocally movable along the rail 63 of the restriction plate 60 between the first and second positions. The driven module 40 is formed with an upper shaft hole 41 and a lower shaft hole 42. The upper and lower shaft holes 41, 42 are respectively formed with circular cross-sectional sections 41a, 42a and noncircular (for example, rectangular) cross-sectional sections 41b, 42b. The third link device 300 or the driven module 40 is arranged between the two fixing boards 93, 94 (or the first and fourth shafts 10, 45). This is obviously different from the structural form of the transmission mechanism of the conventional rotary shaft.
2. Especially, the multi-axis rotary shaft link device meets the requirements for lightweight and thin design of electronic apparatus. This is achieved in such a manner that in cooperation with the link unit 50, the cooperative gaps or motional ranges between the rotary shafts and the components are as minified as possible. That is, the gaps between the transmission units 33 of the first shaft 10 and the third shaft 35 (or the fifth shaft 55) and the reaction units 44 of the second shaft 20 and the fourth shaft 45 (or the sixth shaft 65) are as minified as possible. In this case, the entire electronic apparatus 90 can be designed with a simplified structure and beautiful appearance to improve the shortcoming of the conventional rotary shaft structure that the components have larger volume and occupy much room. Moreover, in condition of easy assembly, according to the specification of the product (or the electronic apparatus), the number of the link devices can be easily changed or adjusted to achieve the object of modularized assembly and easy production.

3. The first and second shafts 10, 20 (or the third and fourth shafts 35, 45, the fifth and sixth shafts 55, 65), the link units 50, the restriction plates 60, the torque module 30 and the driven module 40 are assembled and enclosed in the case 70. The case 70 can move in accordance with the rotation/operation of the display module 91 and the apparatus body module 92. In this case, the link device has a tidy appearance and provides a decorative effect. Also, the lubricant applied to the link device is uneasy to leak outsides.

In conclusion, the multi-axis rotary shaft link device of the present invention is effective and different from the conventional rotary shaft structure in space form. The multi-axis rotary shaft link device of the present invention is inventive, greatly advanced and advantageous over the conventional rotary shaft structure.

The above embodiments are only used to illustrate the present invention, not intended to limit the scope thereof. Many modifications of the above embodiments can be made without departing from the spirit of the present invention.

What is claimed is:

1. A multi-axis rotary shaft link device at least comprising:

an assembly of a first link device and a second link device, the first link device including a first shaft, a transmission unit disposed on the first shaft, a second shaft in parallel to the first shaft and a reaction unit disposed on the second shaft, at least one link unit in the form of a plate-shaped body being disposed between the transmission unit of the first shaft and the reaction unit of the second shaft, two ends of the link unit being formed with driving sections respectively engaged with the transmission unit of the first shaft and the reaction unit of the second shaft, whereby the first and second shafts synchronously rotate, the second link device being identical to the first link device in structure, the second link device including a third shaft, a transmission unit disposed on the third shaft, a fourth shaft in parallel to the third shaft and a reaction unit disposed on the fourth shaft, at least one link unit in the form of a plate-shaped body being disposed between the transmission unit of the third shaft and the reaction unit of the fourth shaft, two ends of the link unit being formed with driving sections respectively engaged with the transmission unit of the third shaft and the reaction unit of the fourth shaft, whereby the third and fourth shafts synchronously rotate, each of the first, second, third and fourth shafts having a pivoted section and an assembled section; and a driven module having an internal upper shaft hole and an internal lower shaft hole, the second and third shafts being respectively assembled in the internal upper and lower shaft holes of the driven module, whereby the multi-axis rotary shaft link device freely rotates around multiple rotational centers.

2. The multi-axis rotary shaft link device as claimed in claim 1, wherein the driven module is a sleeve structure, the internal upper and lower shaft holes being respectively formed with circular cross-sectional sections and noncircular cross-sectional sections, a tail end section of the pivoted section of each of the first, second, third and fourth shafts being formed with a noncircular cross-sectional structure, the tail end section of the second shaft being inserted in the noncircular cross-sectional section of the internal upper shaft hole of the driven module, the tail end section of the third shaft being inserted in the noncircular cross-sectional section of the internal lower shaft hole of the driven module.

3. The multi-axis rotary shaft link device as claimed in claim 2, wherein the driven module is disposed in a third link device, the third link device being identical to the first link device in structure, the third link device including a fifth shaft having a transmission unit and a sixth shaft having a reaction unit, at least one link unit in the form of a plate-shaped body being disposed between the transmission unit of the fifth shaft and the reaction unit of the sixth shaft, two ends of the link unit being formed with driving sections respectively engaged with the transmission unit of the fifth shaft and the reaction unit of the sixth shaft, whereby the fifth and sixth shafts synchronously rotate, each of the fifth and sixth shafts having a pivoted section and an assembled section, a tail end section of the pivoted section of each of the fifth and sixth shafts being formed with a noncircular cross-sectional structure, the first and second link devices being respectively assembled with a torque module and a driven module, the third link device being also assembled with a torque module, the torque module and driven module of the first link device being assembled with the assembled sections of the first and second shafts, the torque module and driven module of the second link device being assembled with the assembled sections of the third and fourth shafts, the torque module and driven module of the third link device being assembled with the assembled sections of the fifth and sixth shafts.

4. The multi-axis rotary shaft link device as claimed in claim 2, wherein the transmission unit of the first shaft is disposed between the pivoted section and assembled section of the first shaft, the transmission unit of the third shaft being disposed between the pivoted section and assembled section of the third shaft, the reaction unit of the second shaft being disposed between the pivoted section and assembled section of the second shaft, the reaction unit of the fourth shaft being disposed between the pivoted section and assembled section of the fourth shaft, the transmission units and the reaction units being gear structures, the driving sections of the link unit being formed at the two ends thereof as a row of tooth structures, a support section protruding from at least one side of the link unit or the link unit being formed with an assembling hole for assembling with a support section, restriction plates being disposed on at least one side of the transmission unit of the first shaft and at least one side of the reaction unit of the second shaft, two ends of each restriction plate being formed with shaft holes for pivotally connecting with the first and second shafts respectively, a middle section of the restriction plate being formed with a rail normal to an axis of the restriction plate, the rail serving to receive the support section of the link unit, whereby the support section and the link unit are permitted to reciprocally move along the rail, restriction plates being disposed on at least one side of the transmission unit of the third shaft and at least one side of the reaction unit of the fourth shaft, two ends of each restriction plate being formed with shaft holes for pivotally connecting with the third and fourth shafts respectively, a middle section of the restriction plate being formed with a rail normal to an axis of the restriction plate, the rail serving to receive the support section of the link unit, whereby the support section and the link unit are permitted to reciprocally move along the rail.

5. The multi-axis rotary shaft link device as claimed in claim 2, wherein the first and second shafts and the link unit of the first link device are together enclosed in an interior space of a case, the case having an opening in communication with the interior space, the other side of the case being formed with an upper shaft hole and a lower shaft opposite to the opening for pivotally connecting with the pivoted sections of the first and second shafts respectively, the third and fourth shafts and the link unit of the second link device being together enclosed in an interior space of another case, the other case having an opening in communication with the interior space, the other side of the other case being formed with an upper shaft hole and a lower shaft opposite to the opening for pivotally connecting with the pivoted sections of the third and fourth shafts respectively.

6. The multi-axis rotary shaft link device as claimed in claim 1, wherein the driven module is disposed in a third link device, the third link device being identical to the first link device in structure, the third link device including a fifth shaft having a transmission unit and a sixth shaft having a reaction unit, at least one link unit in the form of a plate-shaped body being disposed between the transmission unit of the fifth shaft and the reaction unit of the sixth shaft, two ends of the link unit being formed with driving sections respectively engaged with the transmission unit of the fifth shaft and the reaction unit of the sixth shaft, whereby the fifth and sixth shafts synchronously rotate, each of the fifth and sixth shafts having a pivoted section and an assembled section, a tail end section of the pivoted section of each of the fifth and sixth shafts being formed with a noncircular cross-sectional structure, the first and second link devices being respectively assembled with a torque module and a driven module, the third link device being also assembled with a torque module, the torque module and driven module of the first link device being assembled with the assembled sections of the first and second shafts, the torque module and driven module of the second link device being assembled with the assembled sections of the third and fourth shafts, the torque module and driven module of the third link device being assembled with the assembled sections of the fifth and sixth shafts.

7. The multi-axis rotary shaft link device as claimed in claim 6, wherein the transmission unit of the third link device is disposed between the pivoted section and assembled section of the fifth shaft, the reaction unit of the third link device being disposed between the pivoted section and assembled section of the sixth shaft, the transmission unit and the reaction unit being gear structures, the driving sections of the link unit of the third link device being formed at the two ends thereof as a row of tooth structures, a support section protruding from at least one side of the link unit of the third link device or the link unit being formed with an assembling hole for assembling with a support section, restriction plates being disposed on at least one side of the transmission unit of the fifth shaft and at least one side of the reaction unit of the sixth shaft, two ends of each restriction plate being formed with shaft holes for pivotally connecting with the fifth and sixth shafts respectively, a middle section of the restriction plate being formed with a rail normal to an axis of the restriction plate, the rail serving to receive the support section of the link unit of the third link device, whereby the support section and the link unit are permitted to reciprocally move along the rail.

8. The multi-axis rotary shaft link device as claimed in claim 7, wherein the first and second shafts, the link unit, the torque module, the driven module and the restriction plates of the first link device are together enclosed in an interior space of a case, the case having an opening in communication with the interior space, the other side of the case being formed with an upper shaft hole and a lower shaft opposite to the opening for pivotally connecting with the pivoted sections of the first and second shafts respectively, the third and fourth shafts, the link unit, the torque module, the driven module and the restriction plates of the second link device being together enclosed in an interior space of another case, the other case having an opening in communication with the interior space, the other side of the other case being formed with an upper shaft hole and a lower shaft opposite to the opening for pivotally connecting with the pivoted sections of the third and fourth shafts respectively, the fifth and sixth shafts, the link unit, the torque module, the driven module and the restriction plates of the third link device being together enclosed in an interior space of still another case, the still other case having an opening in communication with the interior space, the other side of the still other case being formed with an upper shaft hole and a lower shaft opposite to the opening for pivotally connecting with the pivoted sections of the fifth and sixth shafts respectively.

9. The multi-axis rotary shaft link device as claimed in claim 8, wherein the first shaft is pivotally connected with a fixing board to assemble with a display module of an electronic apparatus, the fourth shaft being pivotally connected with another fixing board to assemble with an apparatus body module of the electronic apparatus, the third link device being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

10. The multi-axis rotary shaft link device as claimed in claim 9, wherein when the display module and the apparatus body module are positioned in a closed position, the support section of the link unit between the transmission unit of the first shaft and the reaction unit of the second shaft is positioned in a first position of the rail of the restriction plate, the support section of the link unit between the transmission unit of the third shaft and the reaction unit of the fourth shaft is positioned in a first position of the rail of the restriction plate, and the support section of the link unit between the transmission unit of the fifth shaft and the reaction unit of the sixth shaft is positioned in a first position of the rail of the restriction plate, when the display module and the apparatus body module are positioned in an opened position, the support section of the link unit between the transmission unit of the first shaft and the reaction unit of the second shaft being moved from the first position to a second position of the rail, the support section of the link unit between the transmission unit of the third shaft and the reaction unit of the fourth shaft being moved from the first position to a second position of the rail, and the support section of the link unit between the transmission unit of the fifth shaft and the reaction unit of the sixth shaft being moved from the first position to a second position of the rail.

11. The multi-axis rotary shaft link device as claimed in claim 7, wherein the first shaft is pivotally connected with a fixing board to assemble with a display module of an electronic apparatus, the fourth shaft being pivotally connected with another fixing board to assemble with an apparatus body module of the electronic apparatus, the third link device being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

12. The multi-axis rotary shaft link device as claimed in claim 11, wherein when the display module and the apparatus body module are positioned in a closed position, the support section of the link unit between the transmission unit of the first shaft and the reaction unit of the second shaft is positioned in a first position of the rail of the restriction plate, the support section of the link unit between the transmission unit of the third shaft and the reaction unit of the fourth shaft is positioned in a first position of the rail of the restriction plate, and the support section of the link unit between the transmission unit of the fifth shaft and the reaction unit of the sixth shaft is positioned in a first position of the rail of the restriction plate, when the display module and the apparatus body module are positioned in an opened position, the support section of the link unit between the transmission unit of the first shaft and the reaction unit of the second shaft being moved from the first position to a second position of the rail, the support section of the link unit between the transmission unit of the third shaft and the reaction unit of the fourth shaft being moved from the first position to a second position of the rail, and the support section of the link unit between the transmission unit of the fifth shaft and the reaction unit of the sixth shaft being moved from the first position to a second position of the rail.

13. The multi-axis rotary shaft link device as claimed in claim 6, wherein the first and second shafts, the link unit, the torque module and the driven module of the first link device are together enclosed in an interior space of a case, the case having an opening in communication with the interior space, the other side of the case being formed with an upper shaft hole and a lower shaft opposite to the opening for pivotally connecting with the pivoted sections of the first and second shafts respectively, the third and fourth shafts, the link unit, the torque module and the driven module of the second link device being together enclosed in an interior space of another case, the other case having an opening in communication with the interior space, the other side of the other case being formed with an upper shaft hole and a lower shaft opposite to the opening for pivotally connecting with the pivoted sections of the third and fourth shafts respectively, the fifth and sixth shafts, the link unit, the torque module and the driven module of the third link device being together enclosed in an interior space of still another case, the still other case having an opening in communication with the interior space, the other side of the still other case being formed with an upper shaft hole and a lower shaft opposite to the opening for pivotally connecting with the pivoted sections of the fifth and sixth shafts respectively.

14. The multi-axis rotary shaft link device as claimed in claim 13, wherein the first shaft is pivotally connected with a fixing board to assemble with a display module of an electronic apparatus, the fourth shaft being pivotally connected with another fixing board to assemble with an apparatus body module of the electronic apparatus, the third link device being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

15. The multi-axis rotary shaft link device as claimed in claim 6, wherein the first shaft is pivotally connected with a fixing board to assemble with a display module of an electronic apparatus, the fourth shaft being pivotally connected with another fixing board to assemble with an apparatus body module of the electronic apparatus, the third link device being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

16. The multi-axis rotary shaft link device as claimed in claim 1, wherein the transmission unit of the first shaft is disposed between the pivoted section and assembled section of the first shaft, the transmission unit of the third shaft being disposed between the pivoted section and assembled section of the third shaft, the reaction unit of the second shaft being disposed between the pivoted section and assembled section of the second shaft, the reaction unit of the fourth shaft being disposed between the pivoted section and assembled section of the fourth shaft, the transmission units and the reaction units being gear structures, the driving sections of the link unit being formed at the two ends thereof as a row of tooth structures, a support section protruding from at least one side of the link unit or the link unit being formed with an assembling hole for assembling with a support section, restriction plates being disposed on at least one side of the transmission unit of the first shaft and at least one side of the reaction unit of the second shaft, two ends of each restriction plate being formed with shaft holes for pivotally connecting with the first and second shafts respectively, a middle section of the restriction plate being formed with a rail normal to an axis of the restriction plate, the rail serving to receive the support section of the link unit, whereby the support section and the link unit are permitted to reciprocally move along the rail, restriction plates being disposed on at least one side of the transmission unit of the third shaft and at least one side of the reaction unit of the fourth shaft, two ends of each restriction plate being formed with shaft holes for pivotally connecting with the third and fourth shafts respectively, a middle section of the restriction plate being formed with a rail normal to an axis of the restriction plate, the rail serving to receive the support section of the link unit, whereby the support section and the link unit are permitted to reciprocally move along the rail.

17. The multi-axis rotary shaft link device as claimed in claim 16, wherein the first and second shafts, the link unit and the restriction plates of the first link device are together enclosed in an interior space of a case, the case having an opening in communication with the interior space, the other side of the case being formed with an upper shaft hole and a lower shaft opposite to the opening for pivotally connecting with the pivoted sections of the first and second shafts respectively, the third and fourth shafts, the link unit and the restriction plates of the second link device being together enclosed in an interior space of another case, the other case having an opening in communication with the interior space, the other side of the other case being formed with an upper shaft hole and a lower shaft opposite to the opening for pivotally connecting with the pivoted sections of the third and fourth shafts respectively.

18. The multi-axis rotary shaft link device as claimed in claim 17, wherein the first shaft is pivotally connected with a fixing board to assemble with a display module of an electronic apparatus, the fourth shaft being pivotally connected with another fixing board to assemble with an apparatus body module of the electronic apparatus, the driven module being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

19. The multi-axis rotary shaft link device as claimed in claim 18, wherein when the display module and the apparatus body module are positioned in a closed position, the support section of the link unit between the transmission unit of the first shaft and the reaction unit of the second shaft is positioned in a first position of the rail of the restriction plate, and the support section of the link unit between the transmission unit of the third shaft and the reaction unit of the fourth shaft is positioned in a first position of the rail of the restriction plate, when the display module and the apparatus body module are positioned in an opened position, the support section of the link unit between the transmission unit of the first shaft and the reaction unit of the second shaft being moved from the first position to a second position of the rail, and the support section of the link unit between the transmission unit of the third shaft and the reaction unit of the fourth shaft being moved from the first position to a second position of the rail.

20. The multi-axis rotary shaft link device as claimed in claim 16, wherein the first shaft is pivotally connected with a fixing board to assemble with a display module of an electronic apparatus, the fourth shaft being pivotally connected with another fixing board to assemble with an apparatus body module of the electronic apparatus, the driven module being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

21. The multi-axis rotary shaft link device as claimed in claim 20, wherein when the display module and the apparatus body module are positioned in a closed position, the support section of the link unit between the transmission unit of the first shaft and the reaction unit of the second shaft is positioned in a first position of the rail of the restriction plate, and the support section of the link unit between the transmission unit of the third shaft and the reaction unit of the fourth shaft is positioned in a first position of the rail of the restriction plate, when the display module and the apparatus body module are positioned in an opened position, the support section of the link unit between the transmission unit of the first shaft and the reaction unit of the second shaft being moved from the first position to a second position of the rail, and the support section of the link unit between the transmission unit of the third shaft and the reaction unit of the fourth shaft being moved from the first position to a second position of the rail.

22. The multi-axis rotary shaft link device as claimed in claim 1, wherein the first and second shafts and the link unit of the first link device are together enclosed in an interior space of a case, the case having an opening in communication with the interior space, the other side of the case being formed with an upper shaft hole and a lower shaft opposite to the opening for pivotally connecting with the pivoted sections of the first and second shafts respectively, the third and fourth shafts and the link unit of the second link device being together enclosed in an interior space of another case, the other case having an opening in communication with the interior space, the other side of the other case being formed with an upper shaft hole and a lower shaft opposite to the opening for pivotally connecting with the pivoted sections of the third and fourth shafts respectively.

23. The multi-axis rotary shaft link device as claimed in claim 22, wherein the first shaft is pivotally connected with a fixing board to assemble with a display module of an electronic apparatus, the fourth shaft being pivotally connected with another fixing board to assemble with an apparatus body module of the electronic apparatus, the driven module being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

24. The multi-axis rotary shaft link device as claimed in claim 1, wherein the first shaft is pivotally connected with a fixing board to assemble with a display module of an electronic apparatus, the fourth shaft being pivotally connected with another fixing board to assemble with an apparatus body module of the electronic apparatus, the driven module being positioned between the fixing board and the other fixing board, a subsidiary case being arranged between the fixing board and the other fixing board at two ends of the electronic apparatus, the subsidiary case being formed with two subsidiary shaft holes extending in an axial direction of the subsidiary case, one end of each of the subsidiary shaft holes being formed with a noncircular cross-sectional structure, the other end of each of the subsidiary shaft holes being formed with a circular cross-sectional structure for assembling with a shaft pin.

\* \* \* \* \*